(12) United States Patent
Hines

(10) Patent No.: US 7,799,987 B1
(45) Date of Patent: Sep. 21, 2010

(54) SOLAR TRACKER

(76) Inventor: Stephen P. Hines, 1540 Wabasso Way, Glendale, CA (US) 91208

( * ) Notice: Subject to any disclaimer, the term of this patent is extended or adjusted under 35 U.S.C. 154(b) by 460 days.

(21) Appl. No.: 11/881,857

(22) Filed: Jul. 30, 2007

(51) Int. Cl.
  H02N 6/00   (2006.01)
  H01L 31/00  (2006.01)
  F24J 2/38   (2006.01)

(52) U.S. Cl. .................... 136/246; 136/243; 250/203.4; 126/600

(58) Field of Classification Search ................ 136/246, 136/259; 250/203.4; 126/600, 604; 60/641.8–641.15
  See application file for complete search history.

(56) References Cited

U.S. PATENT DOCUMENTS

| | | | |
|---|---|---|---|
| 4,046,462 A | | 9/1977 | Fletcher et al. |
| 4,055,161 A | | 10/1977 | Jones |
| 4,089,323 A | | 5/1978 | Trihey |
| 4,276,122 A | | 6/1981 | Snyder |
| 4,283,588 A | * | 8/1981 | Zitzelsberger .............. 136/246 |
| 4,307,711 A | | 12/1981 | Doundoulakis |
| 4,315,500 A | | 2/1982 | Gonder |
| 4,360,004 A | | 11/1982 | Testolini |
| 4,467,787 A | | 8/1984 | Ueda |
| 4,762,298 A | * | 8/1988 | Wood ....................... 248/179.1 |
| 2003/0038022 A1 | | 2/2003 | Rogde |
| 2004/0187907 A1 | | 9/2004 | Morgal |
| 2009/0317442 A1 | * | 12/2009 | Banister et al. ............. 424/423 |

FOREIGN PATENT DOCUMENTS

GB   1552671 A  *  9/1979
JP   60205151 A *  10/1985

OTHER PUBLICATIONS

"Portasol Solar Tracker continuously faces the sun", Engadget, Apr. 15, 2007, <http://www.engadget.com/2007/04/15/portasol-solar-tracker-continuously-faces-the-sun/>.*

* cited by examiner

*Primary Examiner*—Jessica L Ward
*Assistant Examiner*—Jacky Yuen
(74) *Attorney, Agent, or Firm*—Roy L. Anderson; Wagner, Anderson & Bright, LLP

(57) ABSTRACT

A solar tracker has a mounting surface to which a solar device is mounted and means for causing the mounting surface to change its orientation so as to be substantially perpendicular to the sun's rays as the sun travels through a useful arc relative to the solar tracker wherein change of orientation of the mounting surface is caused by bending of the solar tracker attributable. The bending can be caused by mechanical contraction or due to shrinkage caused by loss of water in which case capillary action causes the outer surface material to be saturated and grow when it is not exposed to sunlight. The bendable mounting surface support is an elongated tube held in a nominally vertical position in the absence of sunlight by a vertical support which can be a coiled compression spring, an extruded tube of closed-end structural foam, a vertical floating pole or an air-inflated tube.

17 Claims, 16 Drawing Sheets

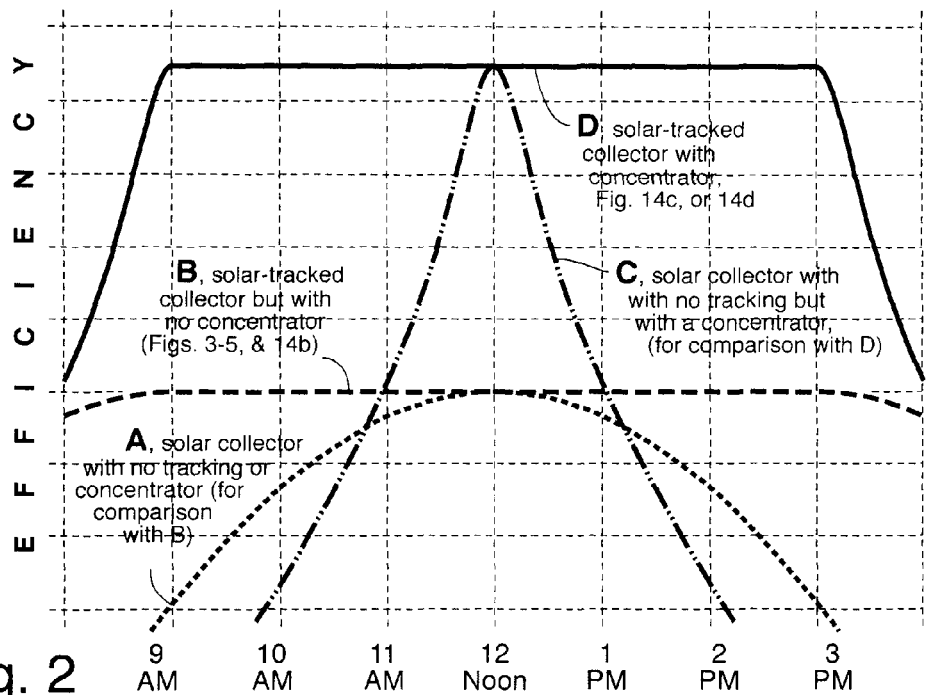
Fig. 2
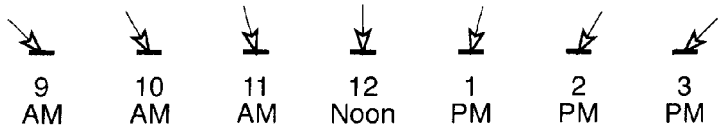
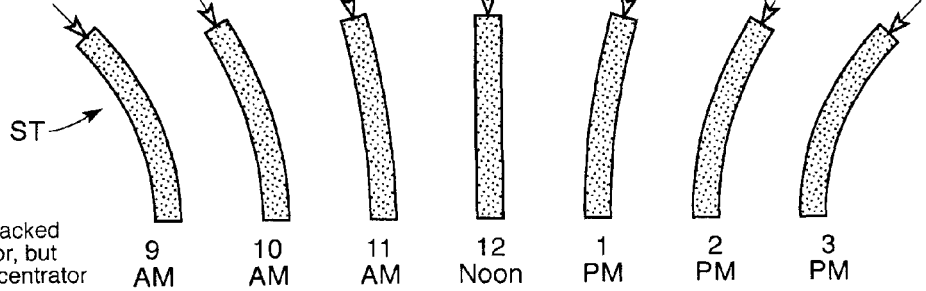

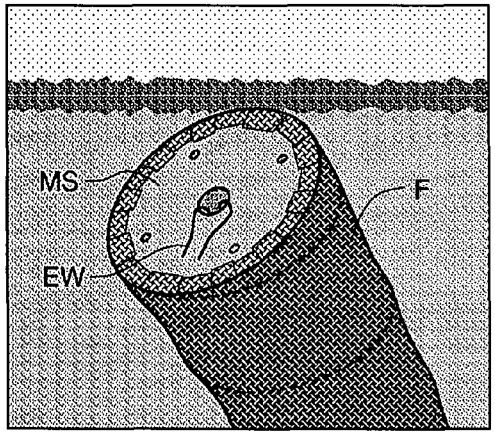 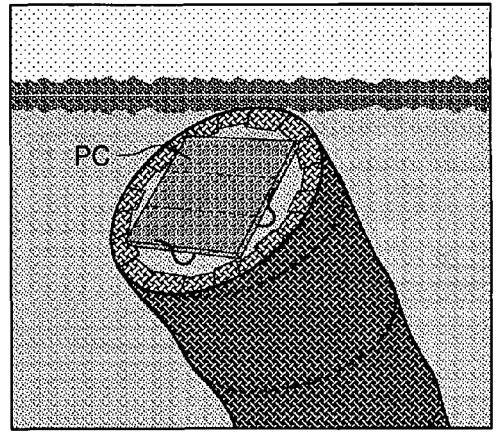
Fig. 14a Fig. 14b
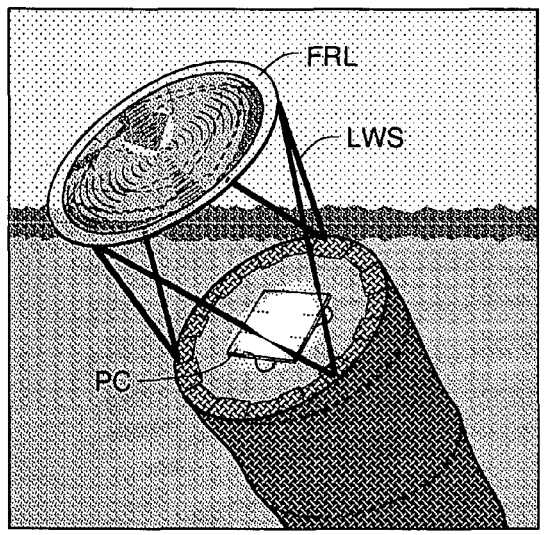 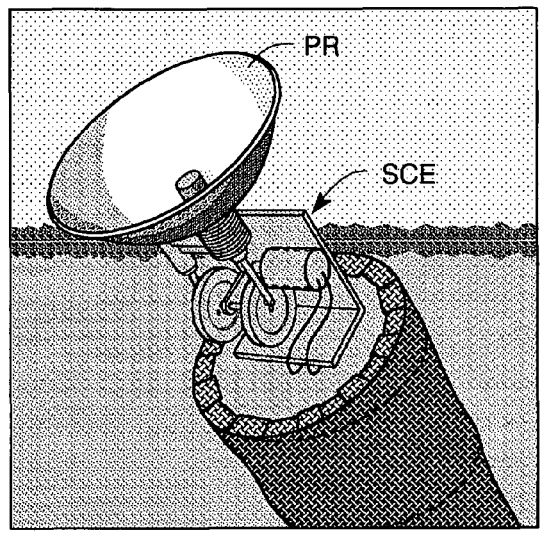
Fig. 14c Fig. 14d

US 7,799,987 B1

SOLAR TRACKER

FIELD OF THE INVENTION

The present invention is in the field of platforms for increasing the efficiency of solar devices.

BACKGROUND OF THE INVENTION

Solar devices represent an important source of energy that is clean and non-polluting, especially as compared to energy derived from burning fossil fuels. Also, as concern continues to grow over greenhouse gasses and the topic of global warming gets more and more attention in the press and throughout the world, solar energy is a very timely subject.

The trouble with solar energy is efficiency and cost.

Although there has been enormous interest in solar energy, and vast amounts of money have been spent on its research and development, solar energy still does not represent as large a proportion of the world's energy as many would hope for, and continue to hope for.

Accordingly, anything that can increase the efficiency of solar energy, without prohibitively increasing its cost, will be welcome indeed. Thus, there exists a very real and long-felt need for ways to increase the efficiency of solar devices.

Moreover, even if solar devices can work efficiently and in a cost-effective manner, there are many different types of applications in which they might be used, if in fact suitable devices were available. Accordingly, another problem addressed by the present invention is increasing the efficiency of solar devices used in remote locations with relatively modest energy requirements, as well as for extremely low cost applications.

SUMMARY OF THE INVENTION

The present invention is generally directed to a solar tracker with a mounting surface to which a solar device is mounted and means for causing the mounting surface to change its orientation so as to be substantially perpendicular to the sun's rays as, the sun travels through a useful arc relative to the solar tracker wherein change of orientation of the mounting surface is caused by bending of the solar tracker.

In a first, separate group of aspects of the present invention, a bendable mounting surface support is provided with an outer surface material that shrinks (due to mechanical contraction or due to shrinkage caused by loss of water) when exposed to sunlight relative to a shaded side of the outer surface material not exposed to sunlight to keep the mounting surface substantially perpendicular to the direction of sunlight as the sun travels through a useful arc relative to the solar tracker.

In another, separate group of aspects of the present invention, the solar tracker is mounted to a platform that floats or sits atop a water source or is in contact with a water reservoir and water is in constant contact with the outer surface material of the bendable mounting surface support so that capillary action causes the outer surface material to be saturated and grow when it is not exposed to sunlight.

In still another, separate group of aspects of the present invention, the solar device (which may be a photovoltaic cell or a Stirling cycle engine coupled with a Fresnel lens or light concentrator) does not extend beyond the mounting surface relative to the bendable mounting surface support.

In yet another, separate group of aspects of the present invention, the bendable mounting surface support is an elongated tube held in a nominally vertical position in the absence of sunlight by a vertical support. The vertical support may be a coiled compression spring, an extruded tube of closed-cell structural foam, a vertical floating pole or an air-inflated tube (which may be maintained inflated by use of electricity generated by the solar device).

In a further, separate group of aspects of the present invention, a method for improving the efficiency of energy collection from a solar device is provided in which a solar device is mounted on a mounting surface of a solar tracker having a bendable mounting surface support with an outer surface material that expands when wet and contracts when dry and the outer surface material is placed in contact with a reservoir of water and then the outer surface material is exposed to the sun so the solar tracker bends in the direction of the sun as the sun travels through a useful arc relative to the solar tracker.

Accordingly, it is a primary object of the present invention to provide a solar tracker that improves the efficiency of energy collection.

This and further objects and advantages will be apparent to those skilled in the art in connection with the drawings and the detailed description of the preferred embodiment set forth below.

BRIEF DESCRIPTION OF THE DRAWINGS

FIG. 2 is a graph showing the efficiency of a solar collector which is stationary versus on a solar tracker.

FIG. 6 illustrates a cross section of a solar tracker according to the present invention that uses a compression spring for support whereas

FIG. 13 illustrates a solar tracker according to the present invention that uses Nitinol wire as the shrinkage mechanism while FIG. 13a shows the Nitinol wire in electrified and non-electrified states.

FIGS. 14a-d illustrates alternative solar devices capable of being used with a solar tracker according to the present invention.

DETAILED DESCRIPTION OF THE PRESENT INVENTION

Figure 1A:
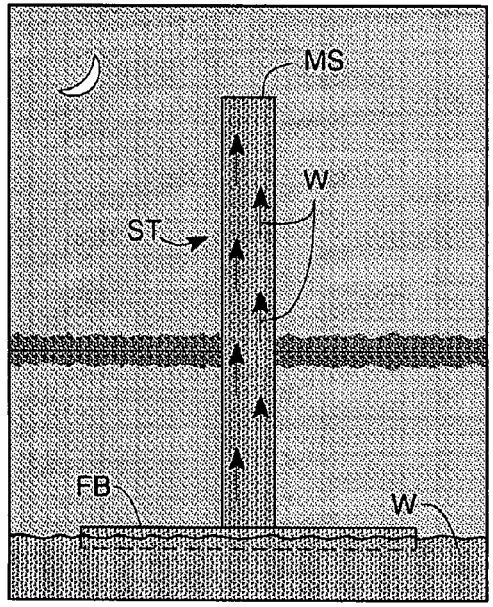
FIGS. 1a-1d generally illustrate a solar tracker according to the present invention showing its positions when there is no sun (FIG. 1a), at sunrise (FIG. 1b), at high noon (FIG. 1c) and in the afternoon (FIG. 1d).

The present invention provides a platform on which solar devices can be mounted to improve their performance in the presence of varying angles of sunlight.

The present invention is not directed to a solar collection device per se, nor to an energy conversion device, but to a platform on which solar devices can be mounted to make them more efficient. See FIGS. 14a-d. A benefit of the present invention is that it is passive, low tech, low cost and virtually maintenance free, making it ideal for third world countries and remote locations like oil drilling rigs and meteorological stations.

The present invention will now be discussed in connection with preferred embodiments illustrated in FIGS. 1-16.

In the Figures and the following more detailed description, letter designations indicate various features relating to the invention, with like letter designations referring to like features throughout both the drawings and the description. Although the Figures are described in greater detail below, the following is a glossary of the elements identified in the Figures.

A adhesive (see FIGS. 7-10)
CC open-cell cellulose covering (see FIGS. 8, 9)
CIS cistern (see FIG. 16)
CS compression spring (see FIG. 6)
CT open-cell cellulose sponge tube (see FIG. 10)
CW counter weight (see FIG. 15)
DS dry side (see FIGS. 1b-d, 3-5, 15)
EC end cap (see FIG. 9)
EW electrical wire (see FIGS. 6-12, 13, 14a, 15)
EXS exposed side (see FIG. 13)
F fabric (see FIGS. 3-7, 12, 14a, 15)
FB floating base (see FIGS. 1a-d, 3-11, 15)
FL float (see FIG. 15)
FRL Fresnel lens (see FIG. 14c)
FT forest tower (see FIG. 16)
HF hardware fasteners (see FIGS. 6-12)
ITB inflated tubular balloon (see FIG. 9)
LC locking collar (see FIG. 15)
LWS light-weight struts (see FIG. 14c)
MS mounting surface (see FIGS. 1a, 6-14a, 15)
N-E Nitinol electrified (see FIG. 13, 13a)
N-NE Nitinol non-electrified (see FIG. 13, 13a)
P pole (see FIG. 15)
PC photovoltaic cell (see FIGS. 3-6, 12, 13, 14b-c)
PR parabolic reflector (see FIG. 14d)
R rain (see FIG. 16)
RO restricted opening (see FIG. 15)
RW rain water (see FIG. 16)
S sun (see FIGS. 1b-d)
SB stationary base (see FIGS. 12-13)
SC socket cup (see FIG. 15)
SCE Stirling cycle engine (see FIG. 14d)
SL solenoid (see FIG. 12)
SFT structural foam tube (see FIGS. 7-8)
SP spacer (see FIG. 11)
SPX spandex (see FIG. 11)
ST solar tracker (see FIGS. 1a-d, 2-5, 11-13, 15-16)
TC tension cable (see FIG. 12)
UXS unexposed surface (see FIG. 13)
VS valve stem (see FIG. 9)
W water (see FIGS. 1a-d, 3-11, 15)
WS wet side (see FIGS. 1b-d, 3-5)

The present invention can use a variety of solar devices. Some examples of solar devices suitable for use with the present invention are photovoltaic cells PC (FIG. 14b) and a Stirling-cycle engine SCE (FIG. 14d). Either of these devices can be enhanced by a concentrating device like a Fresnel lens FRL (FIG. 14c) or a parabolic reflector PR (FIG. 14d).

The solar device that is used with a solar tracker ST is mounted on a mounting surface MS at the top of the solar tracker.

FIG. 14a shows the bare mounting surface MS with electrical wires EW that are available to be attached to a photovoltaic cell PC solar device.

FIG. 14b shows a photovoltaic cell PC mounted to the mounting surface MS at the top of the tube.

FIG. 14c shows a photovoltaic cell which is smaller and less expensive than in FIG. 14b, which is mounted to the mounting surface and sunlight is concentrated by a Fresnel lens FRL, supported by light-weight struts LWS. Without solar tracking, the smaller photovoltaic cell would produce little or no electrical energy. Further, with solar tracking this smaller photovoltaic cell produces much more energy than the larger cell without Fresnel lens.

FIG. 14d shows a parabolic reflector mounted to a Stirling cycle engine SCE and electrical generator mounted to the top of the tube. The Stirling cycle engine SCE works only when sunlight is focused on the tip and therefore the angular alignment with the sun is critical for its operation. A Stirling cycle engine would not work if on a stationary platform except in the rare cases that the sun aligned with the solar concentrator such as a parabolic reflector PR or lens (such as Fresnel lens FRL) for only a few hours a year.

The mounting surface can be supported vertically (relative to the ground) through any number of means so long as the support means has the flexibility to bend within a useful range to follow the sun during the peak hours from approximately 9 AM to 3 PM (6 hrs.×15°/hr.=90° bending (±45°)).

Generally speaking, the support means will have an elongated tube and a mechanism for causing movement of the tube in response to direct sunlight. The elongated tube of solar tracker ST is, in an especially preferred embodiment, cylindrical; however, the tube need not be of an exact cylindrical shape and need not necessarily be of uniform cross-section. For example, a tube with a nominally cylindrical shape or a variation from a cylindrical shape (such as a cylinder with serrated, scalloped, fluted or other longitudinal ridges) might also be used. What is important is that the tube be shaped so as to allow it to perform the function of providing support while still allowing the solar tracker to bend toward the path of the sun as the sun travels in an arc relative to the solar tracker over a useful period of time for collecting sunlight. Also, it is especially preferred that any solar collector mounted to the top mounting surface MS should be no larger than the diameter of the solar tracker tube so as to not shadow the solar tracker ST from the sun and interfere with its function.

A number of examples of means for keeping the tube substantially perpendicular to the sun's rays are set forth in the FIGS. 6-10 in which an outer surface of the tube needs to be made of, covered with, dipped in or coated with a material which expands when wet and contracts when dry. The mechanism for this action is that when water comes in contact with the tube covering, capillary action causes the material to become saturated and engorged with water molecules, pushing apart the material to make room for the water. This makes the wet side of the tube larger and longer. When the surface material dries out, as in the presence of sunlight, the material collapses or shrinks, pulling that side of the tube. Both the pushing on the wet side, and the collapsing on the dry side, bias the tube to bend in a curve toward the dry side. With the appropriate length-to-diameter ratio, the top surface, used for mounting solar devices, will angle over to be perpendicular to the sun's rays. FIGS. 1-5, and 15-16. The bending of the solar tracker ST stops automatically when the dry side DS falls into the shadow of the mounting surface MS, and when the wet side WS is exposed to the sunlight, thus providing a nulling to the bending that self-regulates the positioning of the mounting surface MS.

A first mechanism for vertically supporting a tube used in a solar tracker ST is to use a coiled compression spring CS inside a fabric covering F.

Figure 6A:
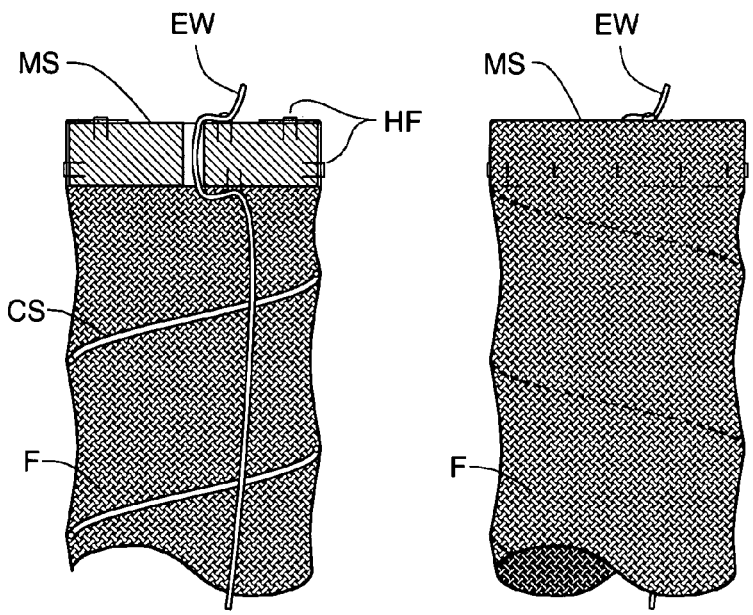
FIG. 6a illustrates the exterior of the same solar tracker.
Figure 6:
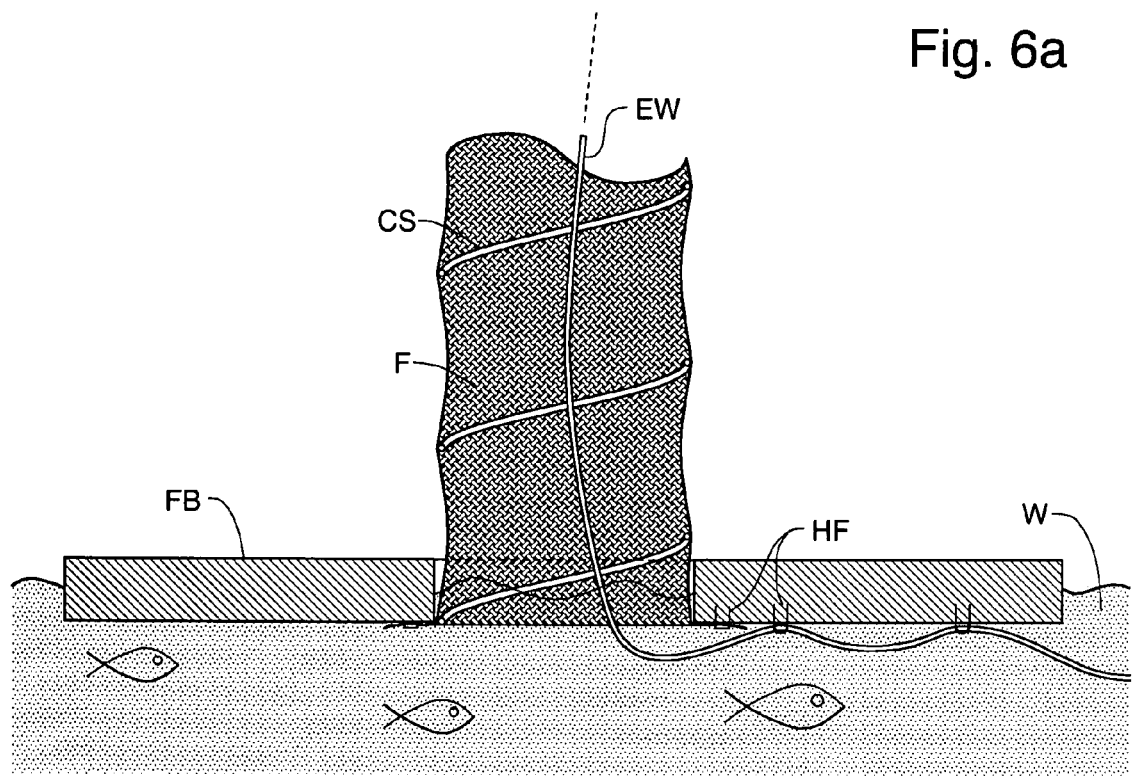

FIG. 6 illustrates an embodiment of the first mechanism. Compression spring CS is preferably made of a material that will resist rust and corrosion such as stainless steel, titanium or fiberglass. The bottom of the fabric F is exposed to water W. FIG. 6a shows the exterior of the same top portion of the tube.

A second mechanism for vertically supporting a tube used in a solar tracker ST is to use an extruded closed-cell structural foam tube SFT (example: polyethylene plastic) that has enough inherent stiffness to hold itself vertically, but with enough flexibility to be bent by the shrinking of the drying outer covering. This material is currently used for boat bumpers.

Figure 7:
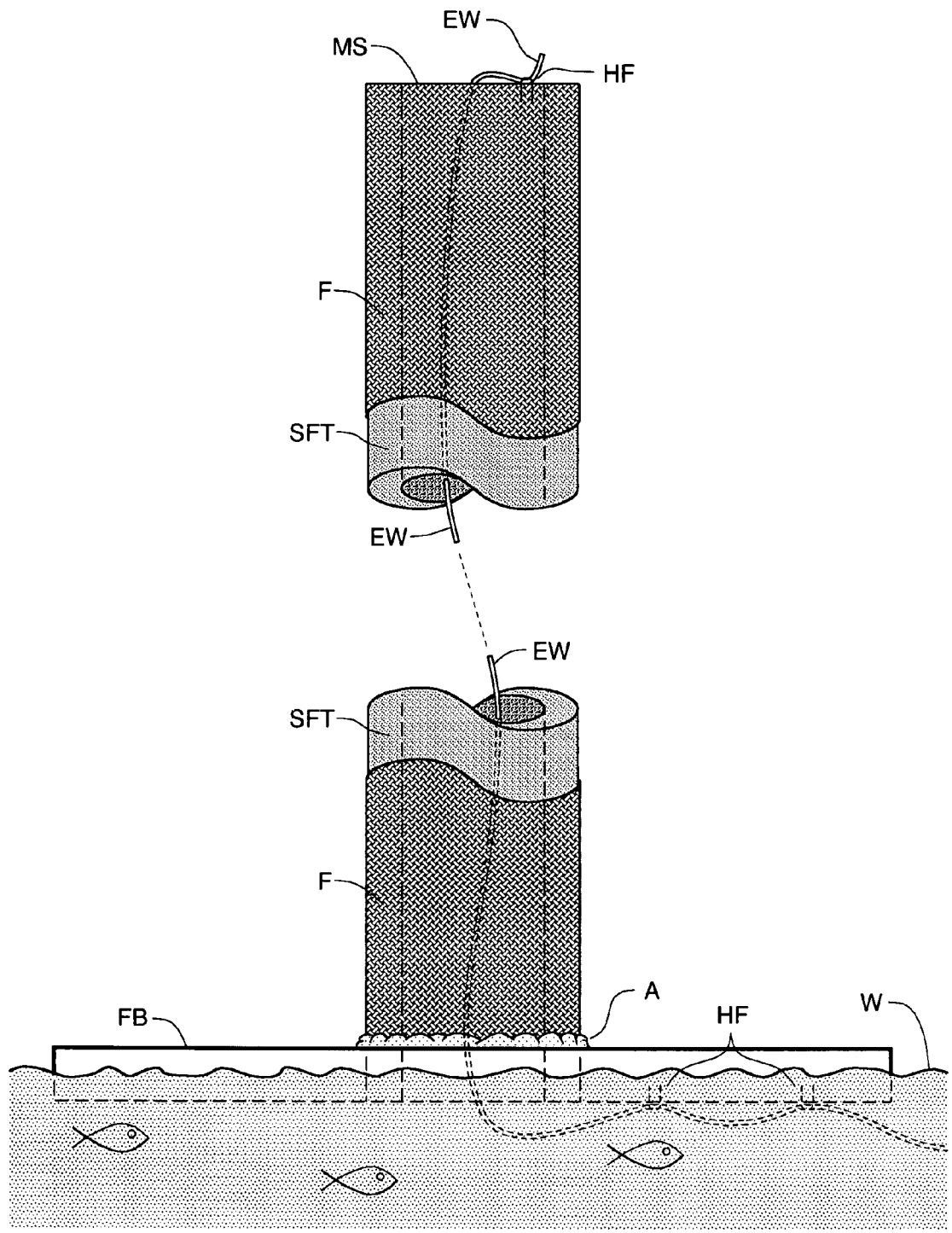
FIGS. 7-12 illustrate solar trackers according to the present invention with support mechanisms differing from that of FIG. 6.
Figure 8:
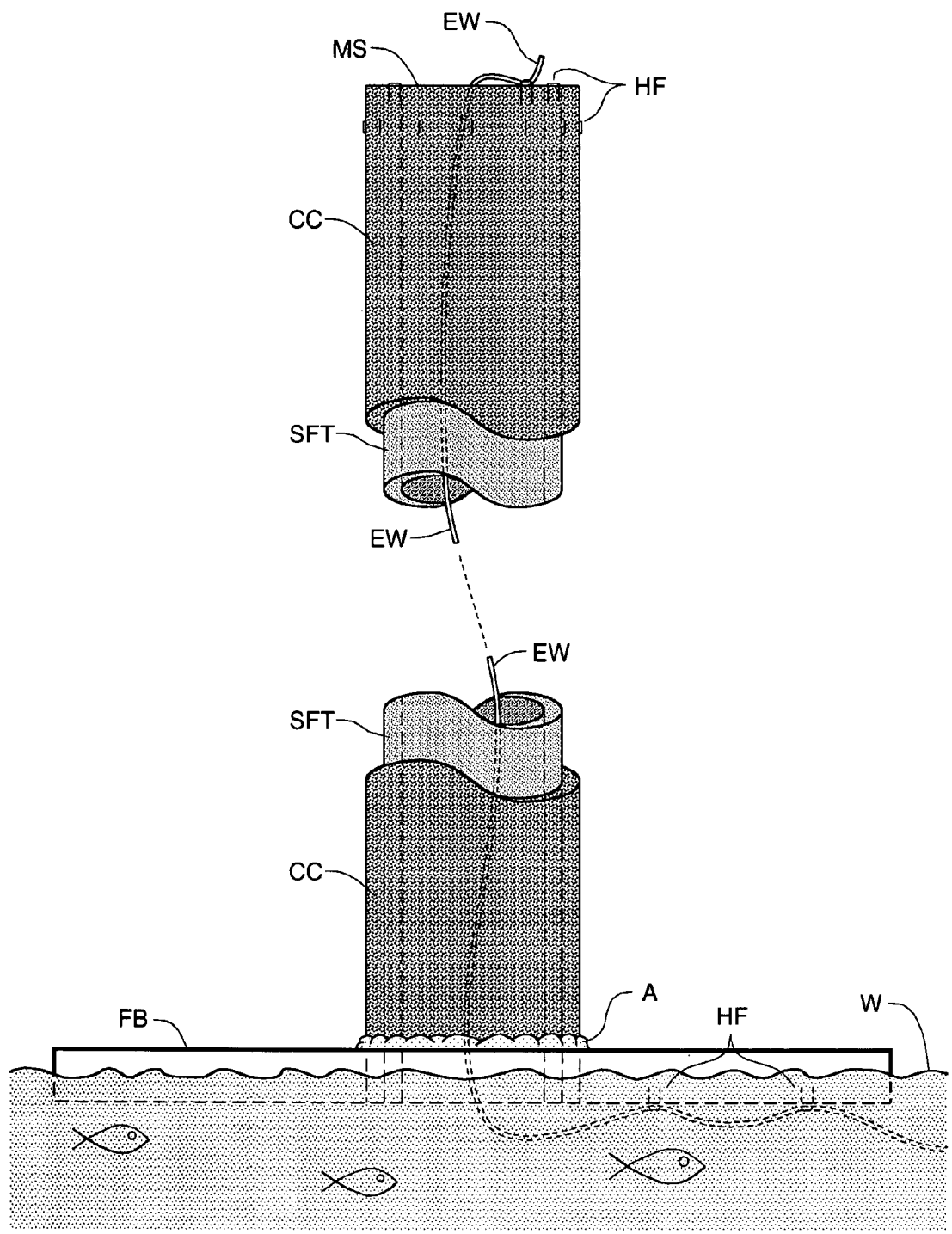

FIGS. 7 and 8 illustrate embodiments of the second mechanism. The tube should have a hole through the center for an electrical wire to pass. (See FIGS. 6-10, 14a.) FIGS. 7 and 8 also show an alternative mechanism for wetting fabric F (as compared to FIG. 6) wherein water is supplied to fabric F due to sloshing of water over floating base FB.

A third mechanism for vertically supporting a tube used in a solar tracker ST is to use a vertical floating pole P that comes up through a loose hole, restricted opening RO, in a base.

Figure 15:
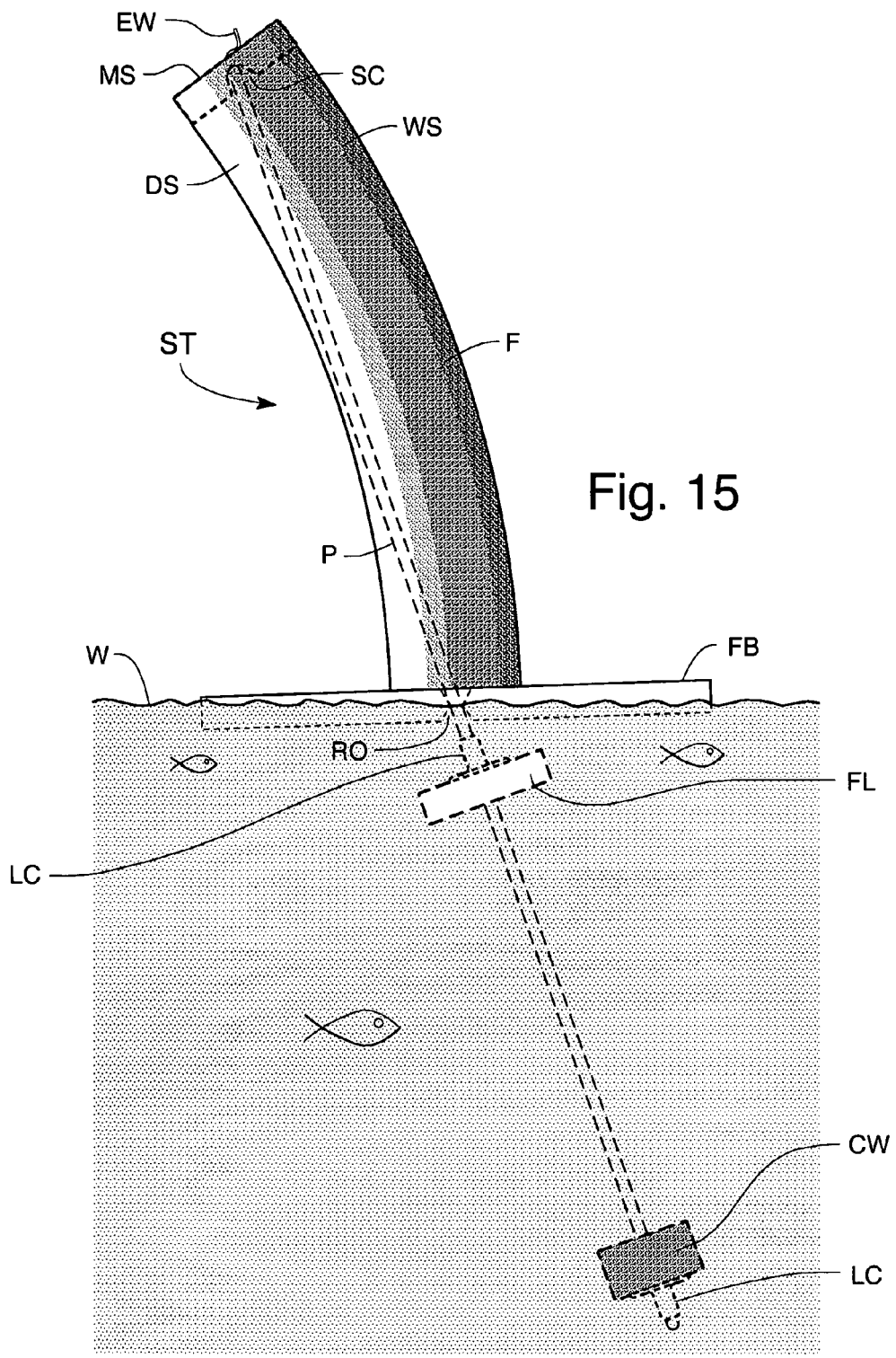
FIG. 15 illustrates a solar tracker according to the present invention that is mounted on a floating platform and where the top of the tube is supported by a separate float mechanism.
Figure 16:
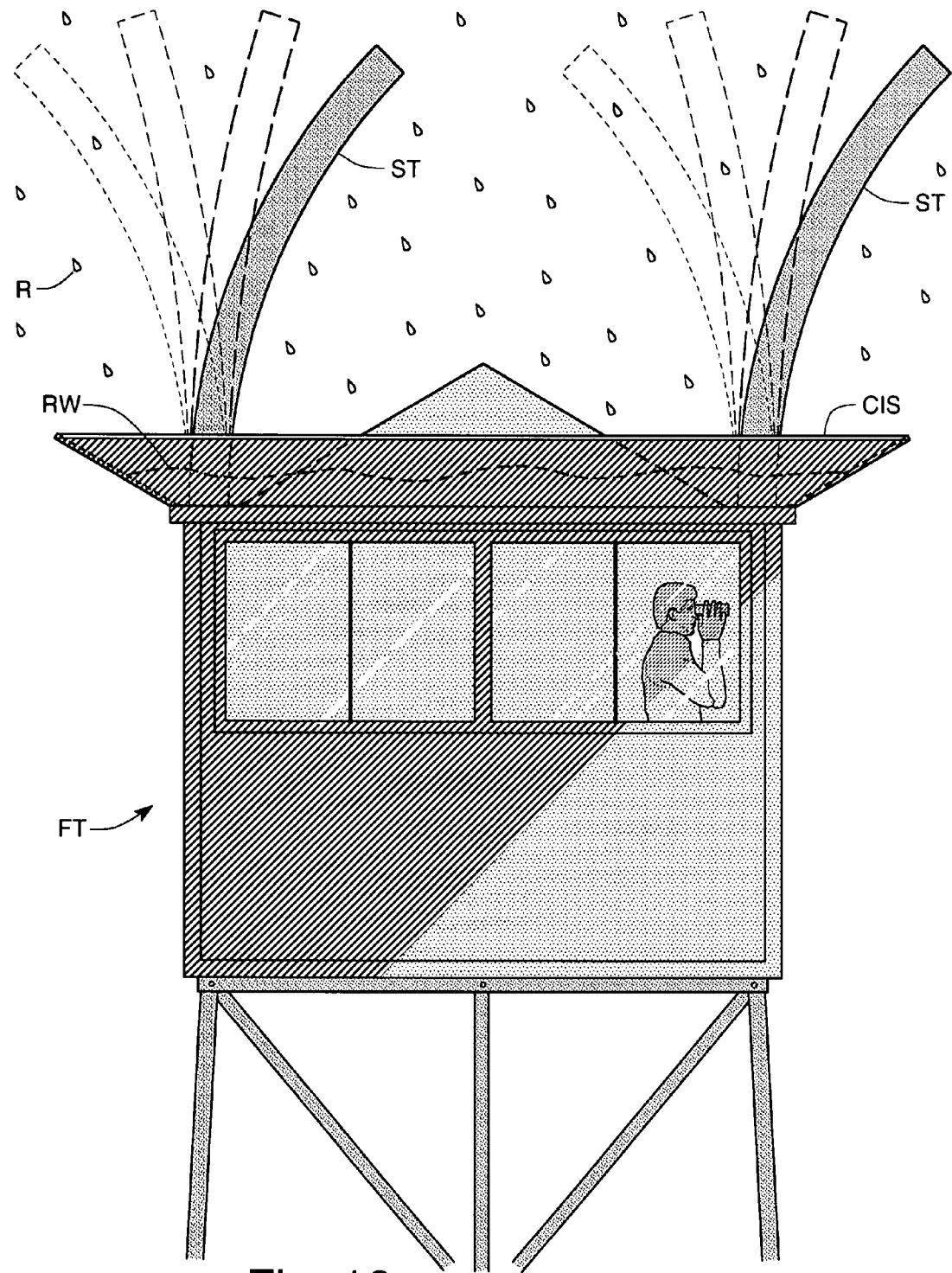
FIG. 16 illustrates a solar tracker according to the present invention designed into the roof of a forest tower.

FIG. 15 illustrates an embodiment of the third mechanism. The top of the pole P pushes upward on the socket cup SC on the underside of the top mounting surface MS, and is itself weighted at the bottom, under water, by counterweight CW to keep the bottom down (and the top up). The pole P fits loosely through a restricted opening RO in the floating base FB so that the solar tracker ST can bend through a useful range during daylight hours. The buoyancy of the float material FL, attached to the pole P underwater, is sufficient to overcome the total weight of (1) the pole P, (2) the counterweight at the bottom CW, (3) the top mounting surface MS, (4), the solar tracker fabric when wet, and (5) the solar collector device to be mounted to the top Mounting Surface MS, so that the mounting surface is raised in all conditions.

A fourth mechanism for vertically supporting a tube used in a solar tracker ST is to use an air-inflated tube.

Figure 9:
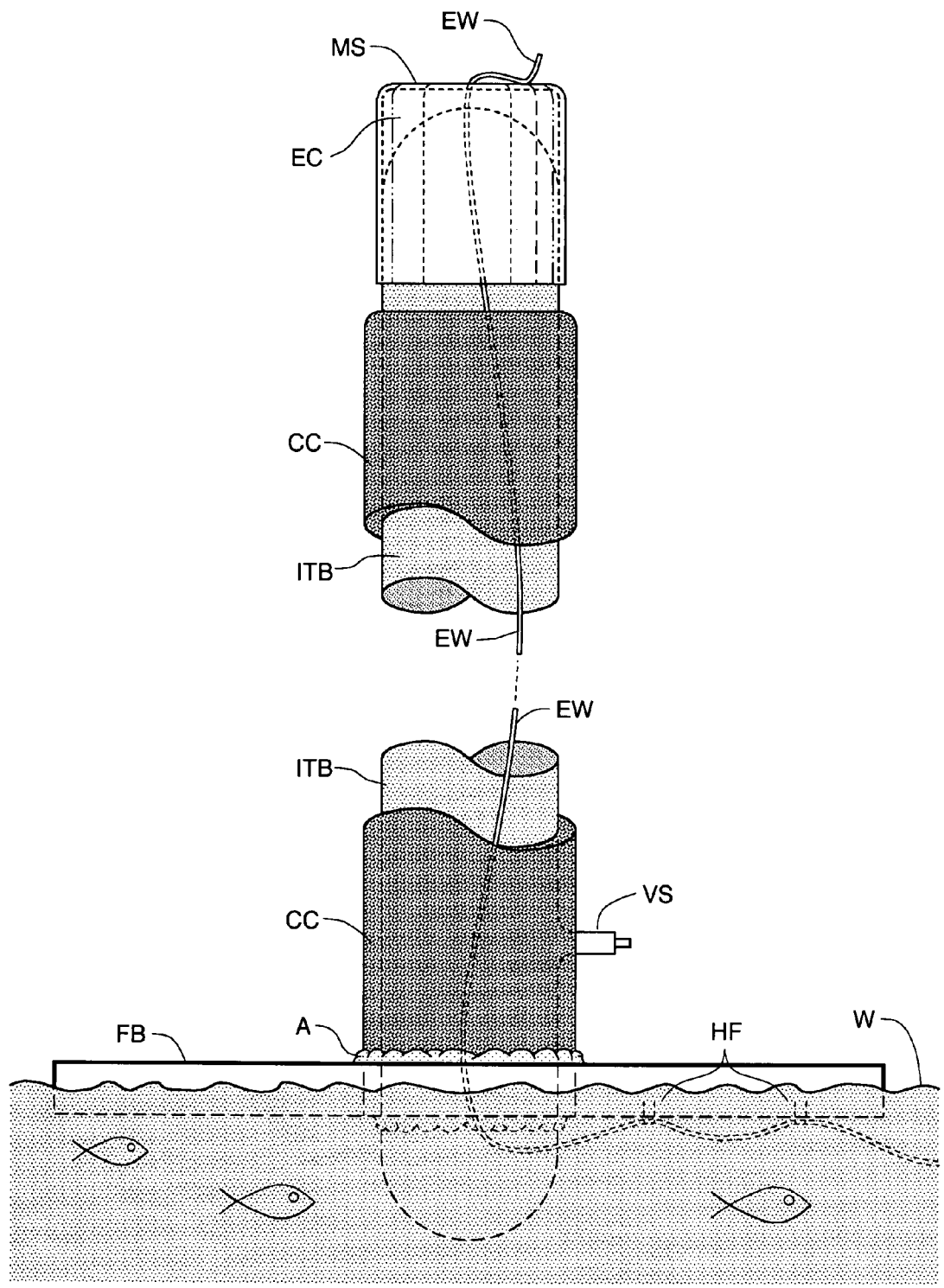

FIG. 9 illustrates an embodiment of the fourth mechanism. Inflated tubular balloon ITB is coated with open-cell cellulose sponge covering CC, topped by end cap EC and mounting surface MS. In this case, to prevent puncturing the tubular balloon, the electrical wire EW is positioned between the inflated balloon and the walls of the end cap EC and inside the open-cell cellulose covering CC. Valve stem VS is used to inflate the balloon to keep it stiff enough to support itself and the chosen solar collector mounted on the mounting surface. The tube is mounted at floating base FB. The air can be sealed in the tube, FIG. 9, like air in a balloon or car tire, or can be inflated continuously using a fan which draws energy from one or more dedicated photovoltaic cells PC. If the tube is open at the bottom, air can be supplied to the inside of the tube with a bubbler from below (not shown), or a fan (not shown) can blow air into the tube powered by one or more dedicated photovoltaic cells PC or a portion of the energy from photovoltaic cells PC mounted on the Mounting Surface MS can be bled off to provide power to the fan, the balance of the energy being routed by electrical wire EW to where it's needed, typically onshore to a home or business.

A fifth mechanism for vertically supporting a tube used in a solar tracker ST is to use a weight, cable, roller and push-rod assembly that can lift the Mounting Surface MS from inside (not shown).

In all of the foregoing five mechanisms, the surface of the tube can be any hydrophilic material, preferably black to absorb the maximum amount of light to dry out the sunny side of the covering. The surface material should have a high expansion to contraction ratio when wet or dry, such as cotton, or open-cell cellulose sponge. The expansion ratio (wet to dry) of fabrics can be enhanced by adding a material like Hydrogel to increase its absorbency. (Hydrogel is a network of polymer chains that are water-insoluble, sometimes found as a colloidal gel in which water is the dispersion medium. Hydrogels are superabsorbent (they can contain over 99% water) natural or synthetic polymers. Hydrogels also possess a degree of flexibility very similar to natural tissue, due to their significant water content.) Bulk materials that contain cellulosic fiber, like an open-cell cellulose kitchen sponge, also work well. See FIGS. 8-10.

Figure 10:
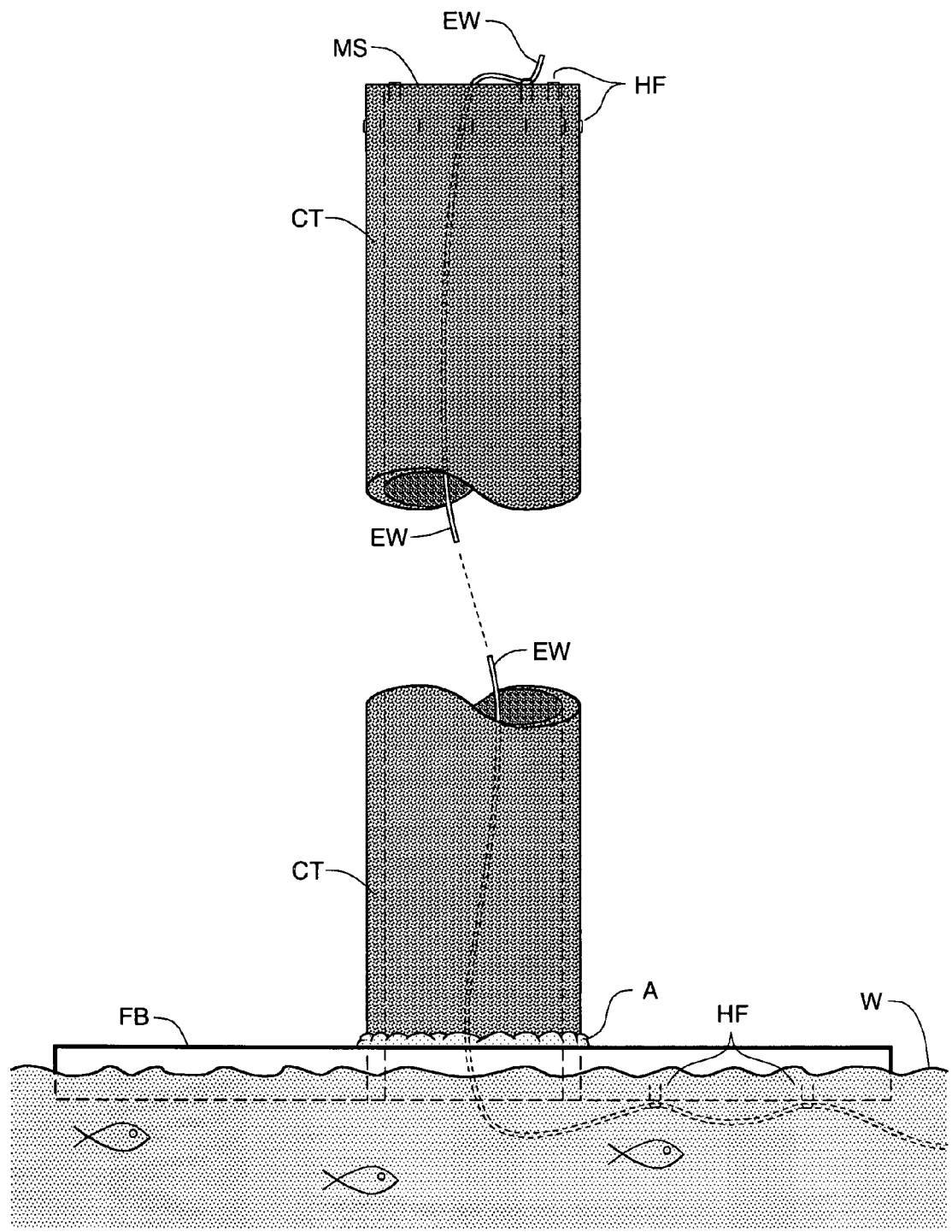

The curving mechanism of a cellulose kitchen sponge can be clearly seen as a damp sponge laying flat on a counter top dries out more on the top surface shrinking the top, pulling the top inward (leaving the bottom relatively damp and expanded) so that the ends lift up with the center in contact with the counter top. A solar tracker using a cellulosic fiber is essentially like a kitchen sponge standing on end, formed in a cylinder for it to have equal freedom to bend in any direction to follow the sun, and FIG. 10 is a simplified design using exclusively a cellulose sponge tube CT whose diameter and wall thickness are chosen to be flexible to bend over the desired angular range but stiff enough to support itself and a solar collector mounted to the mounting surface MS.

Each combination of solar tracker construction materials will provide a certain amount of bending between the shaded and sunny state of the tube. The length, diameter and material of the tube need to be chosen to yield the desired amount of bending. For example, as in FIG. 8, if a 1" thick covering of cellulose sponge over a 10" diameter polyethylene tube with 1" thick wall yielded 2° of bending per linear foot of the tube, the tube would need to be 22.5 ft. long to provide 45° of bending.

Movement of a solar tracker ST of the present invention in accordance with movement of the sun S is illustrated in FIGS. 1a-d.

In FIG. 1a, a solar tracker ST with a vertical cylinder is mounted to floating base FB. Fabric F covering of tube comes in contact with water W. Before the sun S is up, capillary action pulls water up the sides of the cylinder. Fabric is saturated and engorged with water, causing it to elongate. Because all sides of the cylinder are wet, the cylinder expands uniformly on all sides and grows upward and straight.

Figure 1B:
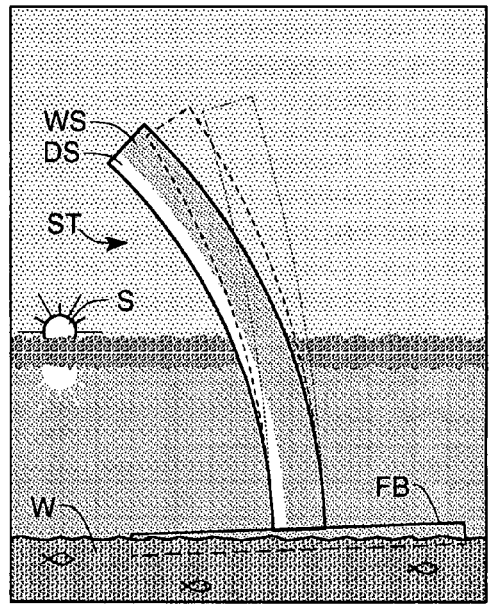

In FIG. 1b, sunlight shines on an exposed surface of the cylinder, drying out the sunny side allowing the fabric to shrink, collapsing the dry side DS down but leaving the wet side WS expanded. This makes the cylinder curve toward the sun so that the top is substantially perpendicular to the sun.

Figure 1C:
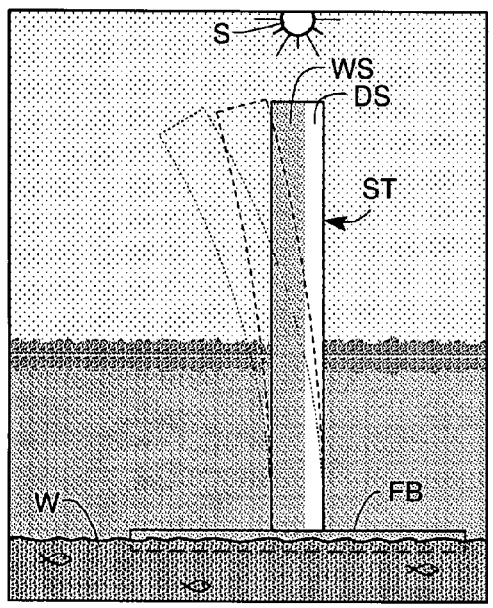
Figure 1D:
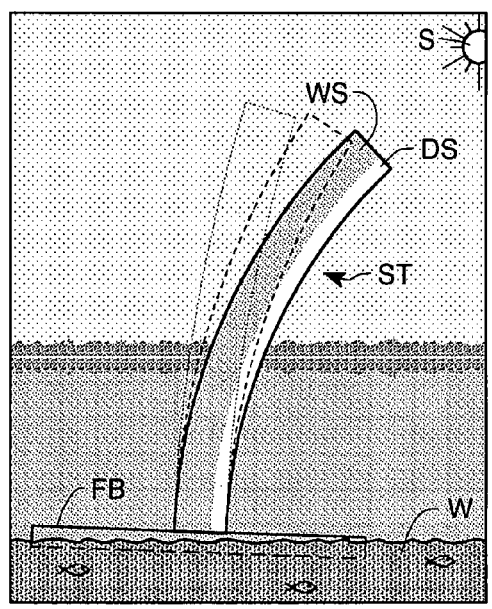

In FIGS. 1c & d, during the day, as the sun's position changes the drying is shifted to different positions on the cylinder, pulling the cylinder in different directions. Any areas which were sunny and dry but are now shady become wet with capillary action. This change causes the cylinder to bend in a different direction, but always making the top mounting surface MS substantially perpendicular to the sun.

The greatly increased efficiency of a solar device obtained by use of a solar tracker in accordance with the present invention is demonstrated in FIG. 2. FIG. 2 graphs the efficiency of solar collectors which are stationary (see box A in FIG. 2) and on a solar-tracker (see box B in FIG. 2) which has the ability to be effective over a 6 hour period, ±3 hours to high noon. At 3 hours from noon (either 9 AM or 3 PM) when the sun is at 45° from overhead, a stationary collector collects only 70.7% of the energy compared to when at noon, calculated as cos α (where α=sun's angle from high noon).

Graph A in FIG. 2 is the efficiency of energy collected on a stationary photovoltaic cell, face up at 0° (not shown but of the type shown in FIG. 14b), for a base-line reference. Graph B in FIG. 2 shows the improvement when that same photovoltaic cell is mounted to a solar tracker ST. The solar-tracked photovoltaic cell operates at 100% efficiency during the entire 6-hour tracking period.

Graphs C and D in FIG. 2 show a much more dramatic improvement in efficiency when using solar collectors with concentrators as in FIGS. 14c and 14d. Graph C is included only for reference since it shows that the efficiency of a non-tracked photovoltaic cell mounted face up under a Fresnel lens is only effective when the sun passes over at high noon. The sun does not reach high noon (directly overhead) except for a few hours a year (and even then, only if located within 23.5° latitude of the equator), so even a solar device with a Fresnel lens as in FIG. 14c, would not be effective unless aimed directly at the sun. Graph D shows the efficiency of the same photovoltaic cell with Fresnel lens on a solar tracker, as shown in FIG. 14c which operates at peak efficiency for the entire 6 hour period of the solar tracker, every day, for the whole year.

A very real advantage of the solar tracker ST is in applications when concentrators are used. FIG. 14d shows a configuration using a parabolic mirror PR and Stirling cycle engine SCE which operate efficiently only when accurately aimed at the sun; however, for weight consideration, the preferred embodiment of this invention is shown in FIG. 14c with a thin Fresnel lens FRL and light-weight struts LWS.

Figure 3:
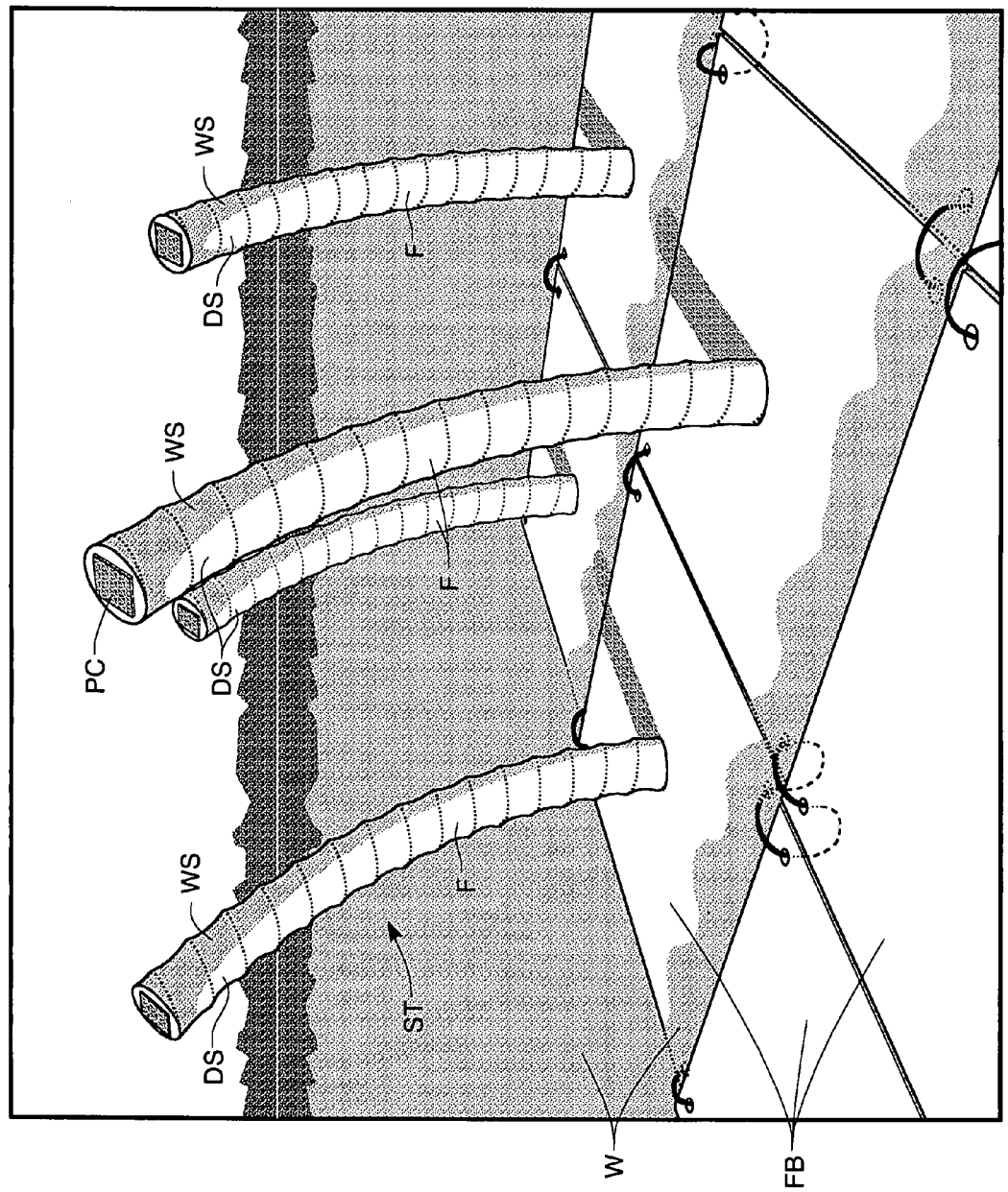
FIGS. 3-5 illustrate a cluster of solar trackers following the sun during the day.
Figure 4:
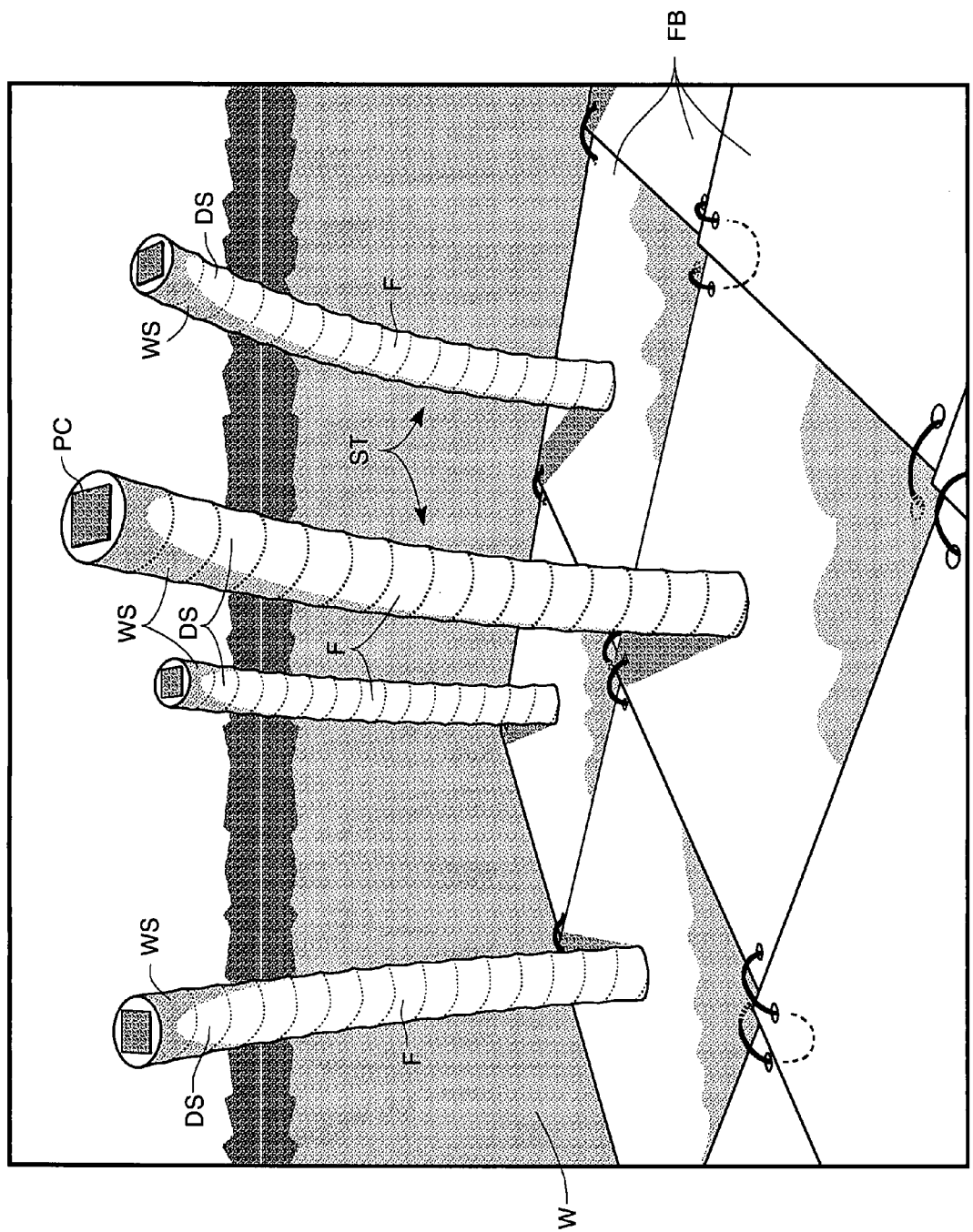
Figure 5:
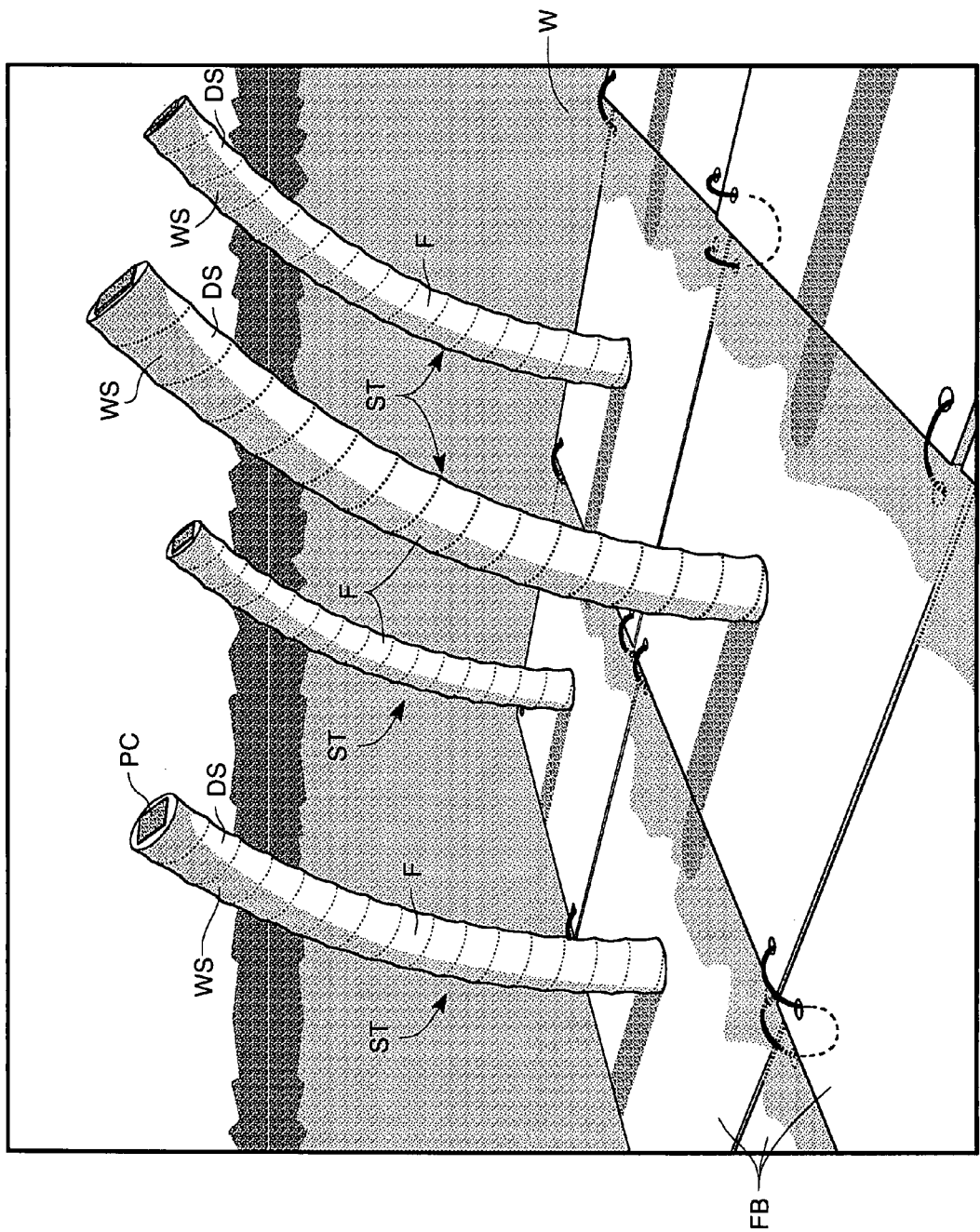

FIGS. 3-5 show a cluster of solar trackers ST following the sun during the day. As sunlight shines on the wet side WS of each solar tracker, the fabric F dries out and shrinks. These same Figures also illustrate how floating bases of multiple solar trackers can be loosely lashed together into a solar tracker "farm" floating on a lake or ocean or other body of water. A farm of solar trackers, fixed or floating on a shallow pond like a rice patty, can be electrically wired together to supply electrical needs. Buoys with warning lights, remote weather transmitters and deep-sea oil-drilling rigs, which are difficult to reach, can also benefit from the increased energy from this solar tracker.

Figures 13, 13A:
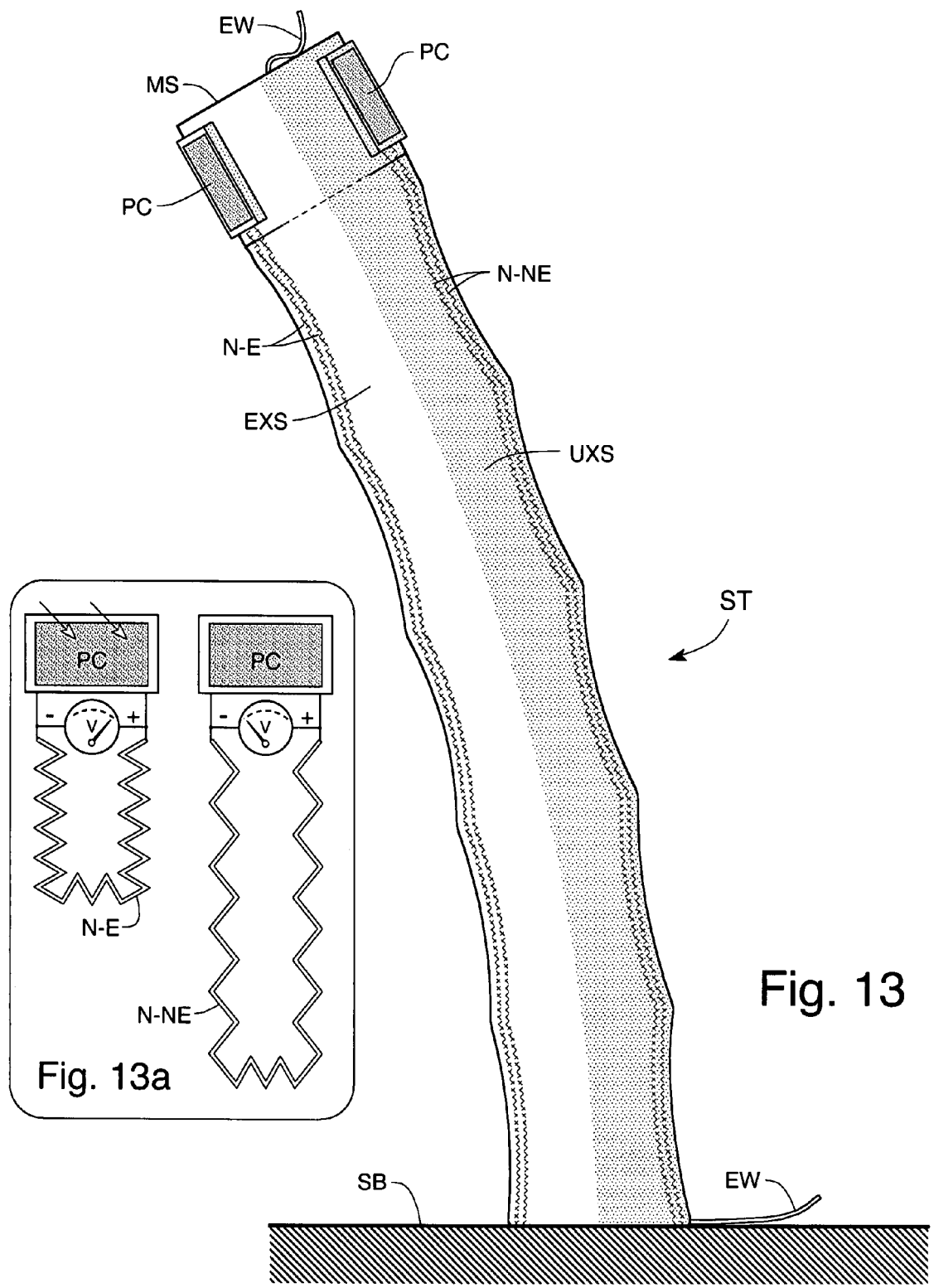

However, the solar trackers ST of the present invention need not only be used on large bodies of water; instead, they can also be placed on the roof of a building (or other locations) as long as the bottoms of the tubes are supplied with water. FIG. 13 illustrates the use of solar trackers ST in a forest tower FT which typically has little or no access to a traditional electrical utility. The roof of this tower incorporates a cistern CIS which collects rainwater RW and which supports four solar trackers ST, one at each corner. The rainwater is collected in a perimeter trench in which the bases of the solar trackers are immersed. Collected water is pulled with capillary action up the absorbent surface of the solar trackers. Photovoltaic collectors supply electricity to the tower for radio communications, lights, etc.

Figure 11:
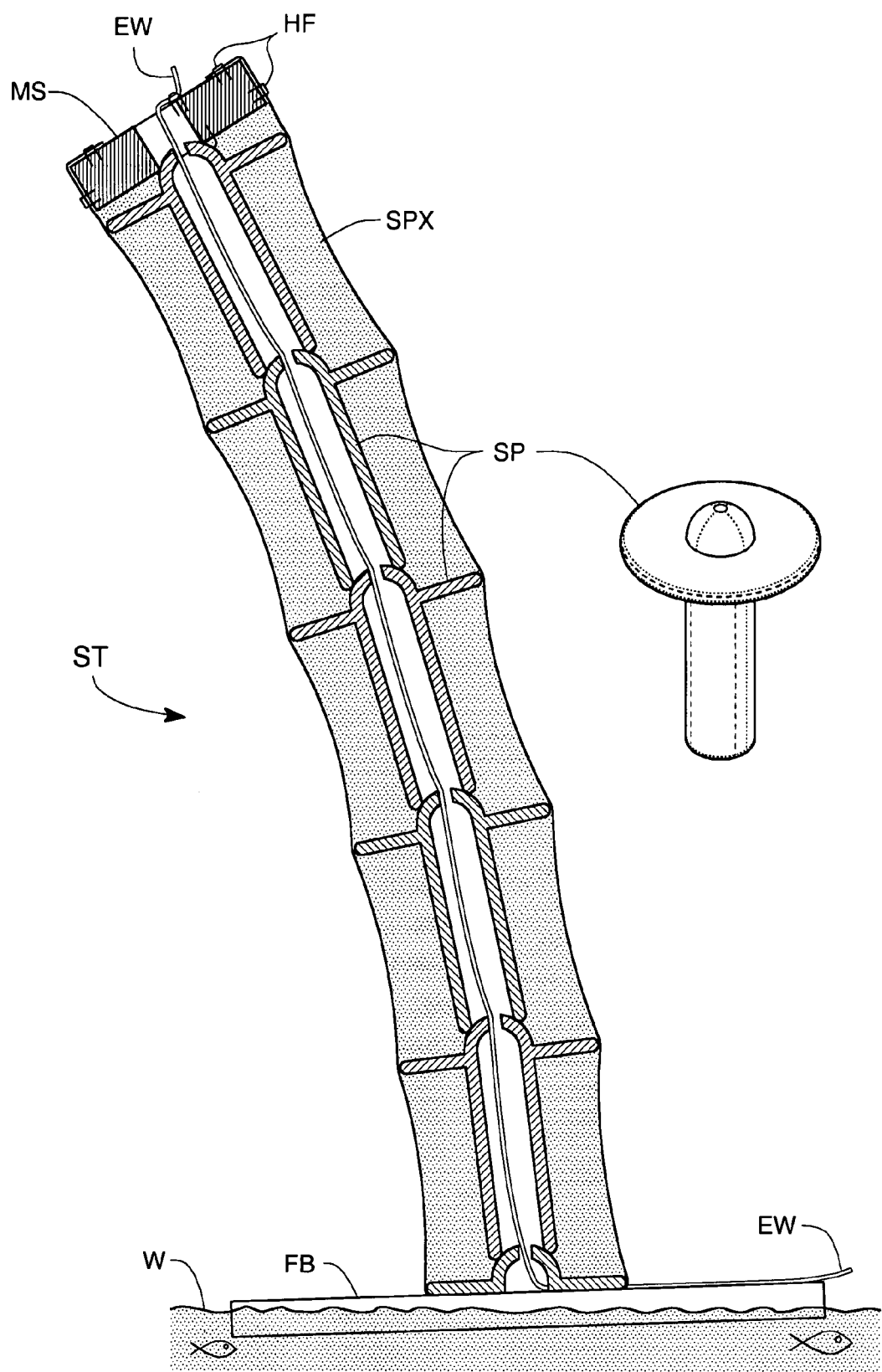
Figure 12:
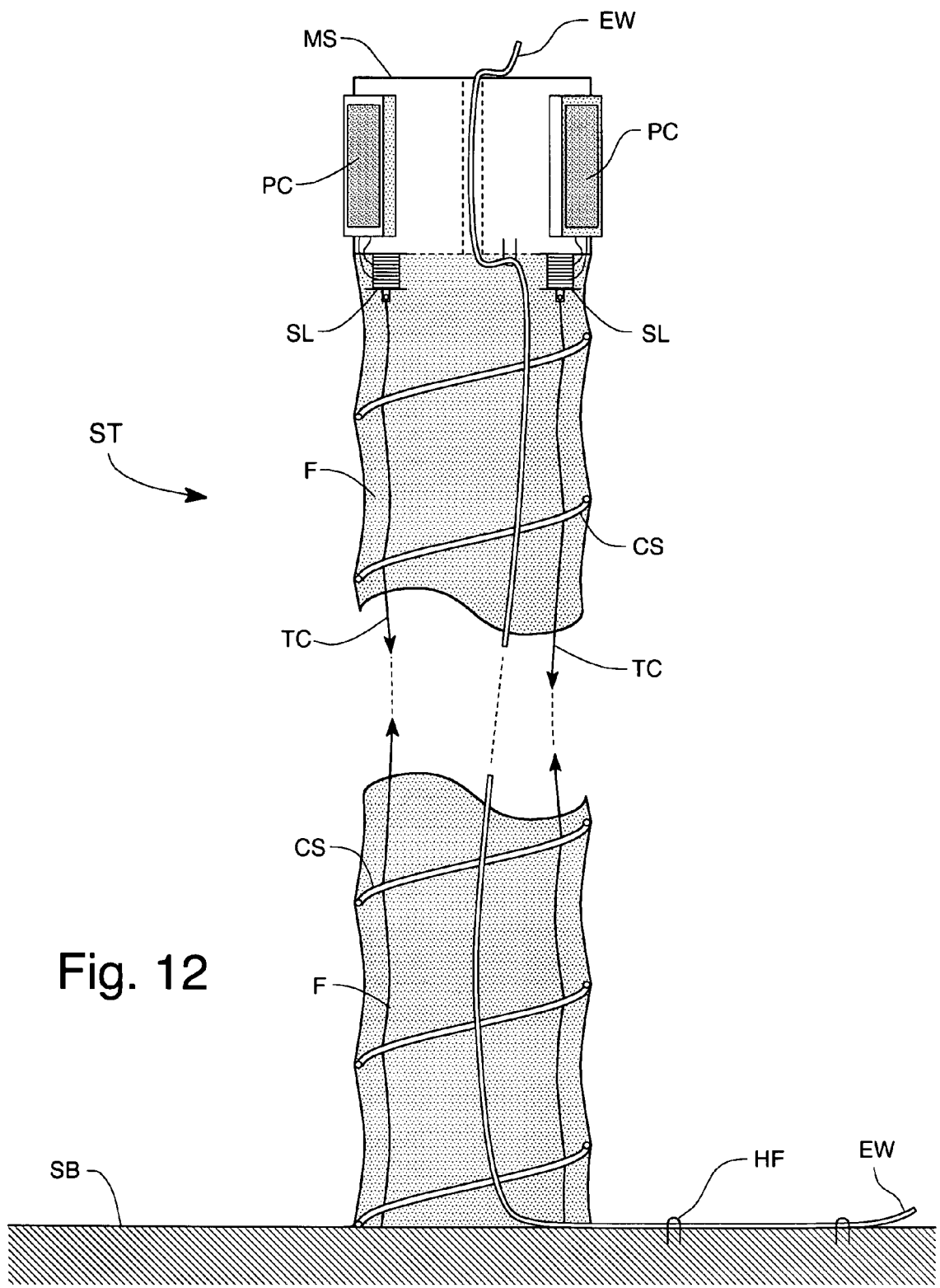

Up until now, each of the embodiments of solar tracker described has utilized bending of the solar tracker caused by a mechanism involving capillary action; however, other methods of mechanically shrinking a surface of the solar track exposed to sunlight can also be used, and FIGS. 11-13 illustrate additional such embodiments of the present invention.

In FIG. 12 three tension cables TC are pulled by solenoids SL powered by photovoltaic cells PC. Because a tension cable TC is only pulled when its photovoltaic cells PC receives sunlight, solar tracker ST is tilted toward sunlight by use of a different mechanism, but in the same fashion, as the solar trackers shown in FIGS. 3-5. If three tension cables TC are used (which is especially preferred, additional cables although not needed, could perform the same function), they should be spaced 120° apart from each other. The solar trackers of FIGS. 11 and 12 have an outer stretchable fabric such as Spandex SPX and the tube is supported by spacers SP that sit on top of one another but allow the tube to bend in whatever direction is caused by tension cables being unevenly tensioned relative to one another about the tube. Whether or not a tension cable is tensioned or not is determined by whether it is on a sunlit surface of the solar tracker associated with a photovoltaic cell PC receiving direct sunlight or a shaded surface of the solar tracker associated with a photovoltaic cell not receiving direct sunlight. The amount a tension cable is tensioned will depend upon the amount of sunlight reaching its photovoltaic cell PC; accordingly, the photovoltaic cell PC must be positioned so that it properly tensions its associated tension cable, and the best location to do this is at the top of the tube support, although this increases the weight that must be supported.

In FIG. 13 the tension cables and solenoids used in FIG. 12 are replaced by Nitinol wires, attached to or woven into the fabric, which are used to bend the tube of solar tracker ST. Nitinol is a shape memory alloy, "SMA" (also known as a smart alloy or memory metal), that "remembers" its geometry. After a sample of SMA has been deformed from its original crystallographic configuration, it regains its original geometry by itself during heating (one-way effect) or, at higher ambient temperatures, simply during unloading (pseudo-elasticity or superelasticity). A photovoltaic cell PC can be used to electrify Nitinol wires so that they get hot and contract and then when they are no longer fed with an electrical current they will resume their non-electrified extended state. FIG. 13a illustrates a Nitinol wire in both an electrified state N-E and in a non-electrified state N-NE. Nitinol wires can be incorporated into a suitable fabric F that stretches by using the zig zag pattern shown.

Although it is believed that the embodiments of FIGS. 11-13 will cost more than embodiments that utilize capillary action to cause bending of the solar tracker, they may be more suitable for use in environments where water is not plentiful, such as arid regions.

While the invention has been described herein with reference to certain preferred embodiments, those embodiments have been presented by way of example only, and not to limit the scope of the invention. Additional embodiments and further modifications are also possible in alternative embodiments that will be obvious to those skilled in the art having the benefit of this detailed description. For example, many of the vertical support mechanisms can be adapted for use in other embodiments, such as using the spacers of FIG. 11 in a solar tracker utilizing capillary action to cause bending of the solar tracker.

Accordingly, still further changes and modifications in the actual concepts described herein can readily be made without departing from the spirit and scope of the disclosed inventions as defined by the following claims.

What is claimed is:

1. A solar tracker, comprising:
    a mounting surface to which a solar device is mounted;
    a bendable mounting surface support with an outer surface material that expands when exposed to water but not exposed to sunlight and contracts when exposed to sunlight that supports the mounting surface; and
    a device for collecting electrical energy from the solar device;
    wherein the outer surface material expands and grows due to absorption of water when it is without sunlight and sunlight shining on the outer surface material causes a sunlit side of the outer surface material to shrink relative to a shaded side of the outer surface material not exposed to sunlight due to drying of the sunlit side thus causing the bendable mounting surface support to bend toward the direction of sunlight so that the mounting surface is substantially perpendicular to said direction of sunlight as the sun travels through a useful arc relative to the solar tracker.

2. The solar tracker of claim 1, wherein the solar tracker is mounted to a platform.

3. The solar tracker of claim 2, wherein the platform sits atop a water source and the water is in constant contact with the outer surface material so that capillary action causes the outer surface material to be saturated when it is not exposed to sunlight.

4. The solar tracker of claim 3, wherein the platform floats atop the water source.

5. The solar tracker of claim 2, further comprising:
a water reservoir in constant contact with the outer surface material so that the capillary action causes the outer surface material to be saturated when it is not exposed to sunlight.

6. The solar tracker of claim 1, wherein the solar device does not extend beyond the mounting surface relative to the bendable mounting surface support.

7. The solar tracker of claim 1, wherein the solar device is comprised of a photovoltaic cell and a Fresnel lens held in a fixed position relative to the photovoltaic cell for concentrating sunlight on the photovoltaic cell.

8. The solar tracker of claim 1, wherein the solar device is comprised of a Stirling cycle engine.

9. The solar tracker of claim 8, wherein the solar device is further comprised of a concentrator for concentrating sunlight to the Stirling cycle engine and an electrical generator connected to the Stirling cycle engine.

10. The solar tracker of claim 1, wherein the bendable mounting surface support is an elongated tube.

11. The solar tracker of claim 10, wherein the elongated tube is held in a nominally vertical position in the absence of sunlight by a vertical support.

12. The solar tracker of claim 11, wherein the vertical support is comprised of a coiled compression spring.

13. The solar tracker of claim 11, wherein the vertical support is comprised of an extruded tube of closed-cell structural foam.

14. The solar tracker of claim 11, wherein the vertical support is comprised of a nominally vertical floating pole.

15. The solar tracker of claim 11, wherein the vertical support is comprised of an air-inflated tube.

16. The solar tracker of claim 15, wherein the air-inflated tube is maintained inflated by use of electricity generated by the solar device.

17. The solar tracker of claim 1, wherein the device for collecting electrical energy is an electrical wire.

\* \* \* \* \*